US005179356A

United States Patent [19]

Kröner

[11] Patent Number: 5,179,356

[45] Date of Patent: Jan. 12, 1993

[54] CIRCUIT ARRANGEMENT FOR THE COMPENSATION OF THE CONTROL CURRENT OF A TRANSISTOR

[75] Inventor: Klaus Kröner, Hamburg, Fed. Rep. of Germany

[73] Assignee: U.S. Philips Corporation, New York, N.Y.

[21] Appl. No.: 758,914

[22] Filed: Sep. 11, 1991

[30] Foreign Application Priority Data

Sep. 21, 1990 [DE] Fed. Rep. of Germany ....... 4029889

[51] Int. Cl.[5] ............................................. H03F 3/16

[52] U.S. Cl. .................................. 330/288; 323/315; 330/291

[58] Field of Search ...................... 330/288, 293, 291; 323/315, 316

[56] References Cited

U.S. PATENT DOCUMENTS 3,714,600 1/1973 Kuijk et al. ......................... 330/288
3,911,353 10/1975 Plassche ............................. 323/315
4,567,426 1/1986 Plassche et al. .................... 323/315

FOREIGN PATENT DOCUMENTS 56-46308 4/1981 Japan .................................. 330/288
60-77506 5/1985 Japan .................................. 330/288

*Primary Examiner*—Paul M. Dzierzynski
*Assistant Examiner*—Tan Dinh
*Attorney, Agent, or Firm*—Bernard Franzblau

[57] ABSTRACT

A circuit for the compensation of a control current of a first transistor whose main current path is arranged in series with a main current path of a second transistor between two supply voltage terminals. The arrangement includes a current mirror circuit including two transistors having a common terminal connected to the one supply voltage terminal which is coupled to the second transistor. The input terminal of the current mirror is connected to a control terminal of the second transistor and its output terminal is arranged to supply a compensation current to a control terminal of the first transistor. The circuit provides an optimum compensation for the control current of the transistor amplifier (first transistor) and even in the case of low supply voltages produces a maximal signal output swing of the first transistor by the provision of a third transistor via whose main current path the compensation current is supplied and whose control terminal is connected to a node between the main current paths of the first transistor and the second transistor.

12 Claims, 1 Drawing Sheet

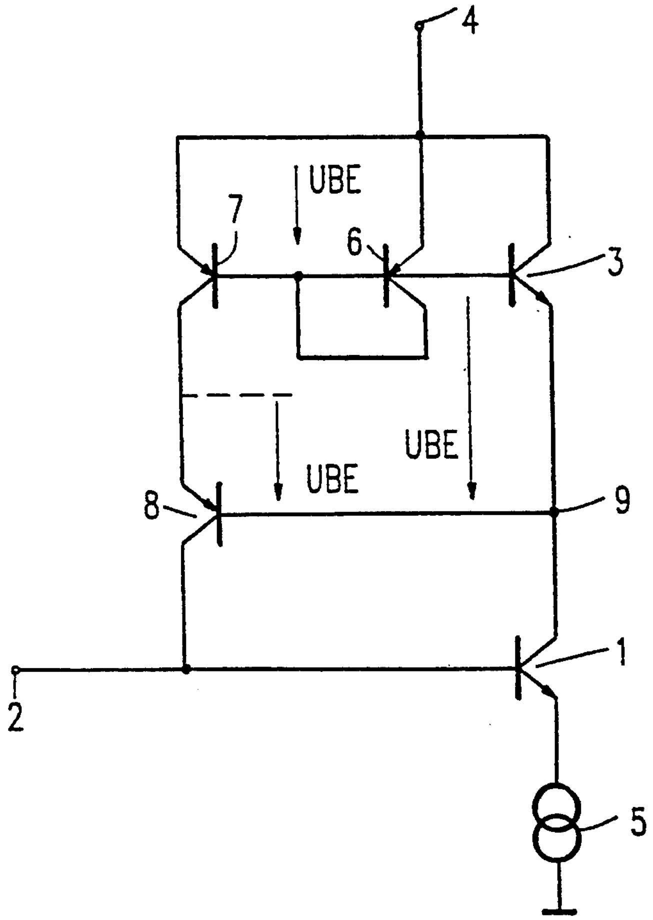
4
UBE
7
6
3
UBE
UBE
8
9
1
2
5

CIRCUIT ARRANGEMENT FOR THE COMPENSATION OF THE CONTROL CURRENT OF A TRANSISTOR

BACKGROUND OF THE INVENTION

This invention relates to a circuit arrangement for the compensation of a control current of a first transistor whose main current path is arranged in series with a main current path of a second transistor between two supply voltage terminals, the arrangement comprising a current mirror circuit having at least two transistors and having a common terminal connected to the supply voltage terminal, which is coupled to the second transistor, an input terminal of the current mirror being connected to a control terminal of the second transistor and an output terminal of the current mirror being arranged to supply a compensation current to a control terminal of the first transistor.

From DE-AS 21 08 550 which corresponds to U.S. Pat. No. 3,714,600 (Jan. 30, 1973), a transistor amplifier is known which comprises a first transistor to whose base a signal to be amplified is applied. The emitter of the first transistor is connected to a point of constant potential, preferably to ground, via a resistor. The collector of the transistor is connected to the emitter of a measurement transistor. The collector of the measurement transistor is connected to a supply voltage source via a second resistor. The base of the measurement transistor is connected to a current input of a controlled current source and the base of the first transistor is connected to a current output of the controlled current source. A common terminal of the current source is connected to the collector of the measurement transistor. The current source comprises a transistor and a diode. The emitter of the transistor of the current source and the anode of the diode are connected to the common terminal of the current source. The collector of the transistor of the current source is connected to the current output of this source and the base of the transistor of the current source and the cathode of the diode are connected to the current input of the current source.

By means of the current source in this circuit arrangement, it is possible to reduce the input current of the amplifier by a factor which substantially corresponds to the base-collector current gain factor of the first transistor and the measurement transistor.

From U.S. Pat. No. 3,916,331 it is further known to replace the current source described above by a current source which is generally also referred to as a "Wilson current mirror". This "Wilson current mirror" comprises a third and a fourth transistor and a diode. The emitter of the third transistor and the anode of the diode are connected to the above-mentioned common terminal of the current source. The base of the third transistor and the cathode of the diode are connected to the emitter of the fourth transistor, whose base is connected to the collector of the third transistor. The collector of the fourth transistor is connected to the output of the "Wilson current mirror" and the collector of the third transistor is connected to the input of the "Wilson current mirror". In comparison with the current source described above, the use of the "Wilson current mirror" has the advantage that the currents appearing at the output and at the input of the "Wilson current mirror" are in better correspondence to one another. This provides an improved compensation of the base current of the first transistor.

However, in comparison with the first-mentioned circuit arrangement the last-mentioned arrangement has the drawback that as a result of the use of the "Wilson current mirror" the potential on the collector of the first transistor is reduced by one further base-emitter forward voltage relative to the potential on the collector of the measurement transistor and on the common terminal of the current source. The range of a signal to be amplified by the transistor amplifier comprising the first transistor is then reduced by this amount. This constitutes a considerable limitation, in particular if the supply voltage for the transistor amplifier should be very small because the further base-emitter forward voltage forms a considerable part of this supply voltage.

SUMMARY OF THE INVENTION

It is an object of the invention to provide a circuit arrangement in which an optimum compensation for the control current of the transistor amplifier is achieved and which, even in the case of low supply voltages, gives a maximal voltage output swing of the transistor.

According to the invention this object is achieved in a circuit arrangement of the type defined in the opening paragraph by means of a third transistor via whose main current path the compensation current is supplied and whose control terminal is connected to a common node of the main current paths of the first transistor and the second transistor.

The circuit arrangement in accordance with the invention simply and advantageously combines the favourable characteristics of the prior art circuit arrangements. As a result of the invention, the voltage level on the collector of the (first) transistor of the transistor amplifier is reduced by only two base-emitter forward voltages relative to the supply voltage, and at the same time a control current compensation is achieved which until now was attainable only with the "Wilson current mirror".

The invention preferably utilizes transistors of the bipolar type. In particular, the first and the second transistor are then of a first conductivity type and the other transistors of a second conductivity type, which results in a construction which is also very suitable for integration on a semiconductor body.

DESCRIPTION OF THE PREFERRED EMBODIMENTS

The Figure shows an exemplary embodiment of a circuit arrangement in accordance with the invention comprising a first transistor 1 which forms a transistor amplifier and which has its base terminal connected to an input 2 for a signal to be amplified. A control current is applied via the control terminal of the first transistor, which is of the npn type in the present example. This control current should be compensated for so as to minimize or preferably cancel the signal current at the input 2. In the ideal case this results in the transistor amplifier, i.e. the first transistor, not being loaded.

The circuit arrangement in accordance with the invention for the compensation of the control current of the first transistor 1 comprises a second transistor 3, also referred to as the measurement transistor. This measurement transistor 3 is also of the npn type and its main current path (i.e. the path between its collector and emitter, is connected in series with the corresponding main current path of the first transistor 1 in a manner such that the emitter of the measurement transistor 3 is coupled to the collector of the first transistor 1. The collector of the measurement transistor 3 is connected to a positive supply voltage terminal 4. Moreover, to establish the operating point a direct current source 5 is arranged in series with the main current paths and is connected between the emitter of the first transistor 1 and ground. The positive supply voltage terminal 4 and ground constitute the terminals of the supply voltage source.

In the present embodiment the circuit arrangement further comprises a current mirror circuit comprising a first current-mirror transistor 6 and a second current-mirror transistor 7, whose emitters are both each connected to the supply voltage terminal 4 and whose base terminals are connected to one another and to the base of the measurement transistor 3. The collector of the first current-mirror transistor 6 is connected to the base terminals of the transistors 3, 6 and 7. The connection between the base terminals of the current-mirror transistors 6, 7 and the collector of the first current-mirror transistor 6 constitutes the input terminal of the current mirror circuit 6, 7. Its output terminal is constituted by the collector of the second current-mirror transistor 7 and is connected to the input 2 and hence to the base of the first transistor 1 via the main current path of a third transistor 8. The base of the third transistor 8, which like the current-mirror transistors 6, 7 is of the pnp type, is connected to the node 9 between the emitter of the second transistor 3 and the collector of the first transistor 1, i.e. to the node between the main current paths of these transistors.

In the Figure, UBE are the base-emitter forward voltages of the transistors which, during operation of the circuit arrangement, appear across the base-emitter junctions of the current-mirror transistors 6, 7, of the measurement transistor 3 and of the third transistor 8. During operation the potential on the collector of the second current-mirror transistor 7 is the same as that on the base of the measurement transistor 3 and hence on the collector of the first current-mirror transistor 6. Thus, the current-mirror transistors 6, 7 have equal collector-emitter voltages, which results in a particularly symmetrical operation of the current mirror 6, 7. Moreover, it will be seen that the potential on the node 9 is only two base-emitter forward voltages UBE lower than the supply voltage on the supply voltage terminal 4.

In the embodiment described above the first transistor 1 and the second transistor 3 are of the npn type and the other transistors are of the pnp type. In a modification of this embodiment, in which the polarity of the supply voltage terminals has been reversed, the first transistor 1 and the second transistor 3 are preferably of the pnp type and the other transistors are of the npn type.

I claim:

1. A circuit arrangement for the compensation of a control current of a first transistor having a main current path connected in series with a main current path of a second transistor between two supply voltage terminals, the arrangement comprising: a current mirror circuit including at least two further transistors having a common terminal connected to that one supply voltage terminal which is coupled to the second transistor, an input terminal of the current mirror being connected to a control terminal of the second transistor and an output terminal of the current mirror being arranged to supply a compensation current to a control terminal of the first transistor, characterised via a main current path of a third transistor whose control terminal is connected to a common node of the main current paths of the first transistor and the second transistor.

2. A circuit arrangement as claimed in claim 1, wherein the transistors are of the bipolar type.

3. A circuit arrangement as claimed in claim 2, wherein the first transistor and the second transistor are of a first conductivity type and the third transistor and the two further transistors are of a second conductivity type.

4. A circuit arrangement as claimed in claim 1, further comprising a DC current source connected in series with the main current paths of the first and second transistors and between the first transistor and the other one of the two supply voltage terminals.

5. A circuit arrangement as claimed in claim 1, wherein one of the two further transistors of the current mirror circuit comprises a diode-connected transistor of opposite conductivity type to the second transistor and the other one of said two further transistors is of the same conductivity type as the diode-connected transistor.

6. A circuit arrangement as claimed in claim 1, wherein one of the two further transistors of the current mirror circuit comprises a diode-connected transistor connected between said one supply voltage terminal and the control terminal of the second transistor and the voltage at the common node is only two base/emitter forward voltages below the voltage of said one supply voltage terminal.

7. A circuit arrangement as claimed in claim 1, wherein the control terminal of the first transistor is DC coupled to a signal input terminal of the circuit.

8. A transistor amplifier circuit with control current compensation comprising:

- a signal input terminal,
- first and second transistors connected in series circuit between first and second DC supply voltage terminals and with a control electrode of the first transistor connected to said input terminal,
- a current mirror circuit including at least two further transistors having a common terminal connected to the first supply voltage terminal, an input terminal connected to a control electrode of the second transistor, and an output terminal arranged to supply a compensation current,
- a third transistor connected between said current mirror circuit output terminal and the control electrode of the first transistor to supply thereto said compensation current, and
- means connecting a control electrode of the third transistor to a common node between the first and second transistors.

9. A transistor amplifier circuit as claimed in claim 8, wherein the first and second transistors are of a first conductivity type and the third transistor and the further transistors are of a second conductivity type.

10. A transistor amplifier circuit as claimed in claim 9, wherein the first and second transistors are npn transistors and the third transistor and the two further transistors are pnp transistors.

11. A transistor amplifier circuit as claimed in claim 9, wherein one of the two further transistors of the current mirror circuit comprises a diode-connected transistor with its emitter connected to the collector of the second transistor.

12. A transistor amplifier circuit as claimed in claim 8, further comprising a DC current source connected in series with the first and second transistors and between the first transistor and the second supply voltage terminal.

* * * * *

UNITED STATES PATENT AND TRADEMARK OFFICE

CERTIFICATE OF CORRECTION

PATENT NO. : 5,179,356

DATED : January 12, 1993

INVENTOR(S) : Klaus kroner

It is certified that error appears in the above-indentified patent and that said Letters Patent is hereby corrected as shown below:

Column 1, line 20, after "550" insert --,--;

Column 2, line 68, change "," to --)--;

Column 3, line 14, delete "both".

Column 3, Claim 1, line 67, delete ", characterised".

Signed and Sealed this

Twenty-second Day of February, 1994

Attest:

BRUCE LEHMAN

*Attesting Officer* *Commissioner of Patents and Trademarks*